US008962971B2

(12) United States Patent
Wu et al.

(10) Patent No.: US 8,962,971 B2
(45) Date of Patent: Feb. 24, 2015

(54) LAMINATED POLYMER FILM AND SOLAR MODULE MADE THEREOF

(75) Inventors: Qiuju Wu, Shanghai (CN); Ruofei Zhao, Shanghai (CN); Shijie Ren, Shanghai (CN); Bo Xu, Shanghai (CN)

(73) Assignee: E I du Pont de Nemours and Company, Wilmington, DE (US)

( * ) Notice: Subject to any disclaimer, the term of this patent is extended or adjusted under 35 U.S.C. 154(b) by 197 days.

(21) Appl. No.: 13/201,525

(22) PCT Filed: Jun. 24, 2009

(86) PCT No.: PCT/US2009/048448
§ 371 (c)(1),
(2), (4) Date: Aug. 15, 2011

(87) PCT Pub. No.: WO2010/101582
PCT Pub. Date: Sep. 10, 2010

(65) Prior Publication Data
US 2011/0297212 A1  Dec. 8, 2011

(30) Foreign Application Priority Data
Mar. 3, 2009 (CN) .......................... 2009 1 0128143

(51) Int. Cl.
| B82Y 30/00 | (2011.01) |
| B32B 27/08 | (2006.01) |
| B32B 7/02 | (2006.01) |
| C09J 7/02 | (2006.01) |
| H01L 31/048 | (2014.01) |
| H01L 31/0216 | (2014.01) |
| B32B 27/36 | (2006.01) |
| B32B 7/12 | (2006.01) |
| B32B 27/28 | (2006.01) |

(52) U.S. Cl.
CPC . *B32B 27/36* (2013.01); *B32B 7/12* (2013.01); *B32B 27/28* (2013.01); *H01L 31/048* (2013.01); *Y02E 10/50* (2013.01); *Y10S 977/814* (2013.01); *Y10S 977/948* (2013.01)
USPC ........... 136/251; 136/256; 428/334; 428/215; 977/814; 977/948

(58) Field of Classification Search
None
See application file for complete search history.

(56) References Cited

U.S. PATENT DOCUMENTS

| 5,053,457 | A * | 10/1991 | Lee .................................. 525/78 |
| 6,407,329 | B1 | 6/2002 | Iino et al. |
| 6,414,236 | B1 | 7/2002 | Kataoka et al. |
| 6,586,271 | B2 | 7/2003 | Hanoka |
| 6,632,518 | B1 | 10/2003 | Schmidt et al. |
| 7,070,675 | B2 | 7/2006 | Schmidt et al. |
| 7,553,540 | B2 | 6/2009 | Debergalis et al. |
| 7,638,186 | B2 | 12/2009 | Hull et al. |
| 8,012,542 | B2 | 9/2011 | Snow et al. |
| 2001/0009160 | A1 | 7/2001 | Otani et al. |
| 2003/0010376 | A1 | 1/2003 | Yamaguchi et al. |
| 2006/0201544 | A1 | 9/2006 | Inoue |
| 2006/0234038 | A1 | 10/2006 | Kernander et al. |
| 2006/0280922 | A1 | 12/2006 | Hull et al. |
| 2007/0154704 | A1 | 7/2007 | Debergalis et al. |
| 2007/0166469 | A1 | 7/2007 | Snow et al. |
| 2008/0023064 | A1 | 1/2008 | Hayes et al. |
| 2008/0128018 | A1 | 6/2008 | Hayes |
| 2008/0135091 | A1 | 6/2008 | Cheng et al. |
| 2008/0156367 | A1 | 7/2008 | Uschold et al. |
| 2008/0216889 | A1 | 9/2008 | Blong et al. |
| 2009/0162652 | A1 | 6/2009 | Ranade et al. |
| 2009/0255571 | A1 | 10/2009 | Xia et al. |
| 2010/0051188 | A1 | 3/2010 | Hull et al. |
| 2011/0108094 | A1 | 5/2011 | Nishijima et al. |
| 2011/0303263 | A1 | 12/2011 | Corfias-Zuccalli et al. |

FOREIGN PATENT DOCUMENTS

| EP | 1182710 B1 | 6/2006 |
| EP | 1930955 A2 | 6/2008 |
| JP | 2006066762 A | 3/2006 |
| JP | 2006165169 A | 6/2006 |
| JP | 2006165232 A | 6/2006 |
| JP | 2008028294 A | 2/2008 |
| JP | 2008108947 A | 5/2008 |
| JP | 2008181929 A | 8/2008 |
| WO | 2008112529 A1 | 8/2008 |
| WO | 2009157545 A1 | 12/2009 |
| WO | 2011044417 A1 | 4/2011 |

OTHER PUBLICATIONS

Tedlar Technical Information (Oct. 1995).*
Allen, "Using Primers in Combination with Adhesive Tie-Layer Resins or Their Blends to Make Structures with Unique Performance," Presentation at TAPPI PLACE Conference (2005).*
Tedlar Adhesive and Lamination Guide (Oct. 1995).*
International Search Report dated Oct. 14, 2009, PCT International Application No. PCT/US2009/048448.
Consentino, Steven et al., Backside Solutions, 2002, pp. 1520-1522, IEEE.

* cited by examiner

* cited by examinerMah, "Fundamentals of Photovoltaic Materials," (Dec. 21, 1998).*

*Primary Examiner* — Ling Choi
*Assistant Examiner* — Catherine S Branch

(57) ABSTRACT

Disclosed is a laminated film having: (a) a substrate; and (b) a bonding layer of ethylene polymer on one major surface of the substrate wherein the bonding layer is placed directly on the substrate or there is a (c) primer layer between the substrate and bonding layer. Also disclosed is a solar module made of such a laminated polymer film.

19 Claims, No Drawings

LAMINATED POLYMER FILM AND SOLAR MODULE MADE THEREOF

FIELD OF THE INVENTION

The present invention relates to a laminated polymer film with improved bonding strength between individual film layers. The laminated polymer film not only has improved bonding strength between individual film layers, but also has improved bonding strength with an ethylene-vinyl acetate copolymer that serves as an encapsulant for solar cell components. The present invention also relates to a solar module made of such a laminated polymer film.

BACKGROUND

With global warming, governments around the world are becoming more and more demanding on energy conservation and emission reduction. Therefore, finding new energy sources to replace fossil fuels has become an urgent issue to resolve.

Solar energy is a clean, pollution-free and inexhaustible energy source. At present, solar energy is utilized primarily via its conversion into electricity by solar modules. The electricity is then used to power electric water heaters, electric vehicles, and satellite components.

A solar module refers to a photovoltaic device generating electricity directly from light, particularly, from sunlight. At present, common examples of solar modules include modules that accommodate crystalline silicon solar cells such as monocrystalline silicon solarcells, polycrystalline silicon solar cells, and nano-silicon solar cells, and thin-film solar cells such as non-crystalline thin-film silicon solar cells, cadmium telluride thin-film solar cells, and copper indium gallium selenide thin-film solar cells.

A crystalline silicon solar module mainly comprises a back sheet, an encapsulant, a photovoltaic circuit and a front sheet. The structure of a thin-film solar cell mainly comprises a photovoltaic circuit placed on a substrate (for example, a glass sheet, polymer sheet or stainless steel sheet), an encapsulant placed on the other surface of the photovoltaic circuit and the substrate, and a front sheet or back sheet placed on the encapsulant.

The encapsulant is used in solar modules to bond the front sheet, the photovoltaic circuit and/or the back sheet together. In a lamination operation carried out at about 150° C., a molten encapsulant flows into voids in a solar cell to encapsulate the solar cell.

At present, commonly used encapsulation materials include ethylene-vinyl acetate copolymers and ionic polymers. However, ionic polymers have disadvantages, including high prices, difficulties in processing and very high hardness. In contrast, ethylene-vinyl acetate copolymers (EVA) have advantages of ease of processing, moderate prices and appropriate flexibility. Therefore, they are the most commonly used polymeric encapsulation materials at present.

The primary role of the front sheet in a solar module is to protect solar cells against mechanical impact and weathering. In order to make full use of the incident light, the front sheet must have a high light transmittance in a certain range of the spectrum (e.g., from 400 to 1,100 nm for crystalline silicon solar cells). The front sheet of prior art solar modules is mainly formed of glass (usually low-iron, tempered flint glass with a thickness of 3 to 4 mm) or polymeric materials.

The primary role of the back sheet in a solar module is to protect the solar cells and the encapsulant against moisture and oxidation. During the process of assembling a solar module, the back sheet is also used as a mechanical shield to prevent scratches and serves as an insulator. Therefore, the back sheet is required to have excellent moisture barrier properties and flexibility, and a good bonding strength with the encapsulant to prevent oxygen and moisture from penetrating into the solar module.

A common back sheet of a solar module is a multi-layer laminated film, mainly comprising a substrate (e.g., a polyester substrate) and a bonding layer on one surface of the substrate.

Although the above-described laminated film has excellent moisture and oxygen barrier properties, the bonding strength between the substrate (e.g., a polyester substrate) and the bonding layer is not completely satisfactory. Sometimes, delamination may take place at the interface between the two layers.

Moreover, the bonding strength between the bonding layer and the encapsulant such as ethylene-vinyl acetate copolymer is also not completely satisfactory. There is still room for improvement.

Therefore, there is a need to provide a laminated film, which has excellent moisture and oxygen barrier properties, excellent bonding strength between its layers, excellent bonding strength with the layer of polyethylene-vinyl acetate resin that serves as an encapsulant for solar cells, and minimizes the use of adhesives and organic solvents.

SUMMARY

Provided is a laminated film that has excellent moisture and oxygen barrier properties, excellent bonding strength between its film layers, and excellent bonding strength with an ethylene-vinyl acetate copolymer that serves as an encapsulant.

Also provided is a crystalline silicon solar module that utilizes the laminated film of the present invention for its back sheet.

Also provided is a thin-film solar module that utilizes the laminated film of the present invention for its back sheet or front sheet.

Thus, provided is a laminated film, which comprises:
(a) a polyester substrate having a first surface and a second surface comprising polymers selected from the group consisting of polyC$_{2-6}$ alkylene phthalates, polyC$_{2-6}$ alkylene naphthalates, and mixtures or blends thereof;
(b) an adhesive layer on the first surface of the polyester substrate;
(c) a primer layer on the second surface of the polyester substrate, wherein the primer layer is less than 0.99 micron thick;
(d) a bonding layer on the primer layer, wherein the bonding layer comprises a copolymer of ethylene and one or more monomers selected from the group consisting of C$_{1-4}$ alkyl acrylates, C$_{1-4}$ alkyl methacrylates, methacrylic acid, glycidyl methacrylate, and maleic anhydride; and
(e) a protective layer on the adhesive layer comprising a fluoropolymer with a tensile modulus of greater than 150 Kpsi.

Provided is a solar module, which comprises a front sheet, a back sheet and a photovoltaic circuit that is encapsulated with an ethylene-vinyl acetate copolymer material, wherein the back sheet is made of the laminated film of the present invention.

Provided is a solar module, which comprises a photovoltaic circuit placed on a glass sheet, polymer sheet or stainless steel sheet, and a front sheet and/or a back sheet made of the laminated film of the present invention.

DETAILED DESCRIPTION

Substrate

The laminated film of the present invention includes a substrate, wherein the substrate material is selected from polyesters or fluorine-containing polymers. A laminated film may comprise a single layer or multiple layers of polyester and a single layer or multiple layers of fluorine-containing polymer, for example, a laminated film of two layers or multiple layers of polyester and fluorine-containing polymer. In another embodiment, there is a coat of metal, metal oxide and/or non-metal oxide on the polyester or fluorine-containing polymer substrate.

Therefore, in embodiments according to the present invention, the substrate may be selected from:

(i) polyesters, for example, poly$C_{2-6}$ alkylene phthalates, poly$C_{2-6}$ alkylene naphthalates, or binary copolymers, polybasic polymers or mixtures thereof;

(ii) fluorine-containing polymers;

(iii) polyesters or fluorine-containing polymers with a coat of metal or metal oxide/non-metal oxide on the surface; or (iv) a laminated film made from two or more materials found above.

Polyester Substrate

When polyesters are used for making substrates, there are no specific restrictions to the polyesters. It may be any polyester film known in the art. It may also be a laminated double-layer or multi-layer polyester film. In one embodiment, the total thickness of the polyester substrate is 30-350 microns, preferably 50-300 microns, and more preferably 70-250 microns.

Non-restrictive examples of polyester material suitable for the substrate include, for example, poly$C_{2-6}$ alkylene phthalates, preferably poly$C_{2-4}$ alkylene phthalates, such as polyethylene terephthalate (PET), polytrimethylene terephthalate, polybutylene terephthalate, polyhexylene terephthalate, polyethylene o-phthalate, polytrimethylene o-phthalate, polybutylene o-phthalate, and polyhexylene o-phthalate, preferably polyethylene terephthalate; poly$C_{2-6}$ alkylene naphthalates, preferably poly$C_{2-4}$ alkylene naphthalates, such as polyethylene naphthalate, polytrimethylene naphthalate, and polybutylene naphthalate; and copolymers and blends of two or more above materials.

Suitable polyester substrate may be formed by film-casting and then treating by biaxial orientation to further improve mechanical strength and gas barrier properties. The film has good mechanical, dielectric, and gas barrier properties.

Suitable polyester substrates may also be purchased from the market, for example, polyethylene terephthalate sheets of various thicknesses may be purchased from E. I. du Pont de Nemours and Company, Wilmington, Del., USA ("DuPont").

Fluorine-Containing Polymer Substrate

There are no specific restrictions to the fluorine-containing polymers suitable for making the substrate. It may be a polymer film formed by any fluorine-containing polymer known in the art. Non-restrictive examples of suitable fluorine-containing polymers include polymers of fluoroethylene; copolymers of fluoroethylene with other non-fluorinated, partially-fluorinated or perfluorinated monomers; polymers of vinylidene fluoride; copolymers of vinylidene fluoride with other non-fluorinated, partially-fluorinated or perfluorinated monomers; polymers of chlorotrifluoroethylene; copolymers of chlorotrifluoroethylene with other non-fluorinated, partially-fluorinated or perfluorinated monomers; polymers of tetrafluoroethylene; and copolymers of tetrafluoroethylene with other non-fluorinated, partially-fluorinated or perfluorinated monomers.

Non-restrictive examples of the other non-fluorinated, partially-fluorinated or perfluorinated monomers include, for example, ethylene, propylene, fluoroethylene, ethylene fluoride, vinylidene fluoride, chlorotrifluoroethylene, hexafluoropropylene, tetrafluoroethylene, perfluoroalkoxyvinyl ether, perfluoropropylene and the like.

Suitable fluorine-containing polymers for the substrate may also be purchased from the market, for example, it may be a Tedlar™ polyfluoroethylene purchased from DuPont, or polyvinylidene fluorides, ethylene-tetrafluoroethylene copolymers or tetrafluoroethylene/hexafluoropropylene/vinylidene fluoride copolymers purchased from Dyneon LLC (Oakdale, Minn.).

The fluorine-containing polymer substrate may also be a laminated film of double-layer or multi-layer fluorine-containing polymer. In one embodiment, the substrate is a laminated film formed from a layer of polyfluoroethylene and a layer of polyvinylidene fluoride, ethylene-tetrafluoroethylene copolymer or tetrafluoroethylene-hexafluoropropylene/vinylidene fluoride copolymer.

The total thickness of the fluorine-containing polymer substrate is 20-350 microns, preferably 20-300 microns, and more preferably 20-250 microns.

Polyester or Fluorine-Containing Polymer Substrate with a Coat of Metal, Metal Oxide and/or Non-Metal Oxide on Its Surface On one or two major surfaces of the above-described polyester substrate or fluorine-containing polymer substrate is coated a single layer or multiple layers of a surface coat selected from metal, metal oxide and non-metal oxide. The surface coated substrate forms a polyester metal-coated substrate or a fluorine-containing metal-coated polymer substrate.

There are no specific restrictions to the suitable metal oxide or non-metal oxide. It may be any metal oxide or non-metal oxide commonly used in the art. In one embodiment, the metal oxide or non-metallic oxide used includes silicon oxide ($SiO_x$, x=1-2) or aluminum oxide ($AlO_x$, x=0.5-1.5). Such an oxide layer is usually deposited by using a chemical vapor deposition (CVD) method on the surface of the polyester or fluorine-containing polymer. The thickness of the oxide layer is usually 50 to 4000 Å, preferably 100 to 1000 Å.

There are no specific restrictions to the suitable metal coat. It may be any metal coat commonly used in the art, for example, a silver foil, an aluminum foil, or a tin foil. An aluminum foil is usually used when cost and other factors are in consideration.

There are no specific restrictions to the thickness of the metal coat. It may be any thickness conventionally used in the art. In one embodiment, a metal coat is used with a thickness of 5-50 microns, preferably 7-25 microns.

A metal coat (e.g., aluminum foil) may be laminated on the polyester or fluorinated polymer substrate by using any methods known in the art. For example, an adhesive may be used to facilitate the lamination process.

The total thickness of the polyester substrate or fluorine-containing polymer substrate that has a metal or metal oxide/non-metal oxide coat on the surface is 8-350 microns, preferably 10-300 microns, and more preferably 12-250 microns.

Laminated Film Polyester Substrate

The laminated substrate of the present invention may also be a laminated film made of a polyester and a fluorine-containing polymer. It may be a laminated film made from a single layer or multiple layers of polyester and a single layer or multiple layers of fluorine-containing polymer. The polyester is the same polyester material as what was described with the polyester substrate above. It may be a laminate made from a single layer of polyester material or multiple layers of polyester material. In one embodiment, on one or two major surfaces of the polyester layer, a layer of the above described fluorine-containing polymer is laminated.

In another embodiment, the laminate of polyester-fluorine-containing polymer is formed by alternate polyester layers and fluorine-containing polymer layers. The polyester layer is a laminate made from a single layer of polyester, or two layers, or multiple layers of polyester. The laminate of fluorine-containing polymer may be a single layer of fluorine-containing polymer, or two layers, or multiple layers of fluorine-containing polymer.

In the laminated film of the polyester and fluorine-containing polymer, the thickness may be any known thickness conventionally used in the art. In one embodiment, a fluorine-containing polymer layer is used with a thickness of 15-50 microns, preferably 20-40 microns.

The total thickness of the laminated film substrate of polyester-fluorine-containing polymer is 30-350 microns, preferably 50-300 microns, and more preferably 70-250 microns.

The method of laminating the polyester layer with the fluorine-containing polymer layer may be any conventional method known in the art. In one embodiment, an adhesive is used for bonding the fluorine-containing polymer layer to the polyester substrate.

There are no specific restrictions for the adhesives for bonding the fluorine-containing polymer layer to the polyester layer. They may be any conventional adhesives known in the art. In one embodiment, a polyurethane adhesive is used, which is formed by mixing PP5250 and I5200 adhesives manufactured by Mitsubishi of Japan according to a ratio of 8-10:1 by weight, preferably 9:1.

There are no specific restrictions to the thickness of the adhesive layer for bonding the fluorine-containing polymer to the polyester, as long as the adhesion strength can meet the requirements. In one embodiment, the thickness of the adhesive layer is in the range of 1-30 microns, preferably 5-25 microns, and more preferably 8-18 microns.

In one embodiment, a laminated film of two layers or multiple layers of polyester/fluorine-containing polymer is used as a substrate. The laminated film is selected from the group consisting of polyfluoroethylene/polyethylene terephthalate laminated film, polyvinylidene fluoride/polyethylene terephthalate laminated film, polyfluoroethylene/polyethylene naphthalate laminated film, polyfluoroethylene/polyethylene terephthalate/polyfluoroethylene laminated film, and polyethylene terephthalate/polyethylene terephthalate/polyethylene terephthalate laminated film.

In another embodiment, a single-layer or multi-layer laminated film comprising a layer of aluminum foil with a thickness of 3-50 microns is used as a substrate. Non-restrictive examples of the substrate include, for example, polyfluoroethylene/aluminum foil/polyethylene terephthalate. The aluminum foil may be bonded with an adhesive on the surface of fluorine-containing polymer or polyester.

In another embodiment, a polyester film with a metal oxide coat on its surface is used as a substrate. Non-restrictive examples of the substrate include, for example, polyfluoroethylene/aluminum oxide/polyethylene terephthalate/polyethylene terephthalate.

The substrate may contain various types of additives, such as photo-stabilizers, thermal stabilizers, hydrolysis resistant agents, surface modifiers, fluorescent brightening agents, light reflecting agents, dyes, and pigments. Particular suitable additives are commonly used additives in the art. When the substrate is a laminated film (for example, polyester laminated film or laminated film of polyester-fluorine-containing polymer), the additives may optionally be added into each layer of the laminated film.

There are no specific restrictions to the content of the additives as long as the additives do not produce an adverse impact on the substrate or strength of the laminated film.

Bonding Layer

The laminated film comprises a bonding layer on one major surface of the substrate for bonding the back sheet to the encapsulant of ethylene-vinyl acetate copolymer. Suitable materials used for forming the bonding layer are ethylene copolymer materials, which are selected from the following groups:

ethylene-$C_{1-4}$ alkyl methacrylate copolymers and ethylene-$C_{1-4}$ alkyl acrylate copolymers, for example, ethylene-methyl methacrylate copolymers, ethylene-methyl acrylate copolymers, ethylene-ethyl methacrylate copolymers, ethylene-ethyl acrylate copolymers, ethylene-propyl methacrylate copolymers, ethylene-propyl acrylate copolymers, ethylene-butyl methacrylate copolymers, ethylene-butyl acrylate copolymers, and mixtures of two or more copolymers thereof, wherein copolymer units resulting from ethylene account for 50%-99%, preferably 70%-95%, by total weight of each copolymer;

ethylene-methacrylic acid copolymers, ethylene-acrylic acid copolymers, and blends thereof, wherein copolymer units resulting from ethylene account for 50-99%, preferably 70-95%, by total weight of each copolymer;

ethylene-maleic anhydride copolymers, wherein copolymer units resulted from ethylene account for 50-99%, preferably 70-95%, by total weight of the copolymer;

polybasic polymers formed by ethylene with at least two co-monomers selected from $C_{1-4}$ alkyl methacrylate, $C_{1-4}$ alkyl acrylate, ethylene-methacrylic acid, ethylene-acrylic acid and ethylene-maleic anhydride, non-restrictive examples of which include, for example, terpolymers of ethylene-methyl acrylate-methacrylic acid (wherein copolymer units resulting from methyl acrylate account for 2-30% by weight and copolymer units resulting from methacrylic acid account for 1-30% by weight), terpolymers of ethylene-butyl acrylate-methacrylic acid (wherein copolymer units resulting from butyl acrylate account for 2-30% by weight and copolymer units resulting from methacrylic acid account for 1-30% by weight), terpolymers of ethylene-propyl methacrylate-acrylic acid (wherein copolymer units resulting from propyl methacrylate account for 2-30% by weight and copolymer units resulting from acrylic acid account for 1-30% by weight), terpolymers of ethylene-methyl acrylate-acrylic acid (wherein copolymer units resulting from methyl acrylate account for 2-30% by weight and copolymer units resulted from acrylic acid account for 1-30% by weight), terpolymers of ethylene-methyl acrylate-maleic anhydride (wherein copolymer units resulting from methyl acrylate account for 2-30% by weight and copolymer units resulting from maleic anhydride account for 0.2-10% by weight), terpolymers of ethylene-butyl acrylate-maleic anhydride (wherein copolymer units resulting from butyl acrylate account for 2-30% by weight and copolymer units resulted from maleic anhydride account for 0.2-10% by weight), and terpolymers of ethylene-acrylic acid-maleic anhydride (wherein copolymer units resulting from acrylic acid account for 2-30% by weight and copolymer units resulting from maleic anhydride account for 0.2-10% by weight);

copolymers formed by ethylene and glycidyl methacrylate with at least one co-monomer selected from $C_{1-4}$ alkyl methacrylate, $C_{1-4}$ alkyl acrylate, ethylene-methacrylic acid, ethylene-acrylic acid, and ethylene-maleic anhydride, non-restrictive examples of which include, for example, terpolymers of ethylene-butyl acrylate-glycidyl methacrylate, wherein copolymer units resulting from butyl acrylate account for 2-30% by weight and copolymer units resulting from glycidyl methacrylate account for 1-15% by weight;

and blends of two or more above-described materials.

The thickness of the bonding layer suitable for the laminated film is 10-400 microns, preferably 40-200 microns.

The bonding layer may have an encapsulation layer for encapsulating the solar module (usually polyethylene-vinyl acetate, polyethylene-methyl acrylate, polyethylene-butyl acrylate, polyethylene-methacrylic acid, ion polymer, polyurethane, or polyvinyl butyral) and has good adhesion properties, good dielectric properties and aging resistance.

The bonding layer may contain various types of additives. Suitable non-restrictive examples are photo-stabilizers, thermal stabilizers, slip agents, light reflecting additives, and pigments.

There are no specific restrictions to the content of the additives in the bonding layer, as long as the additives do not produce an adverse impact on the bonding layer or final adhesion properties of the laminated film.

The bonding layer may be bonded to the substrate by using any methods known in the art. Non-restrictive examples of suitable bonding methods include, for example, melting suitable copolymer resin in an extruder and then coating the melt on the substrate surface by extrusion through an extruder die, or adhering the bonding layer to the substrate with an adhesive.

In one embodiment, the bonding layer is bonded to the substrate without the use an adhesive, particularly without the use an adhesive that is diluted with an organic solvent.

In one embodiment, an ethylene-methyl acrylate copolymer (containing 13% of methyl acrylate by weight, with a melt index of 9, manufactured by DuPont) is melted and extruded out from a single screw extruder at the temperature of 290° C., bonding the melt to a polyethylene terephthalate (PET) substrate.

In addition, the bonding layer may be a laminate of a single-layer material or a double-layer or multi-layer material, for example, the bonding layer of the present invention may be a 2-8 layer, preferably 2-6 layer, more preferably 2-3 layer laminate of the polymer material selected respectively from above-described ethylene copolymer materials.

In one embodiment, the bonding layer is a tri-layer laminate, wherein one layer is a polymer sheet formed from polymer materials selected from ethylene-$C_{1-4}$ alkyl methacrylate copolymers, ethylene-$C_{1-4}$ alkyl acrylate copolymers, ethylene-methacrylic acid copolymers, ethylene-acrylic acid copolymers, and ethylene-maleic anhydride copolymers. Another layer is a polymer sheet formed from a polybasic polymer of ethylene with at least two monomers selected from $C_{1-4}$ alkyl methacrylate, $C_{1-4}$ alkyl acrylate, methacrylic acid, acrylic acid, and maleic anhydride. Another layer is a polymer sheet formed from a glycidyl methacrylate-containing polybasic polymer of ethylene and glycidyl methacrylate formed from at least one co-monomer selected from $C_{1-4}$ alkyl methacrylate, $C_{1-4}$ alkyl acrylate, methacrylic acid, acrylic acid and maleic anhydride. The tri-layer polymer sheet has approximately the same thickness so that the final polymer sheet that serves as a bonding layer has a thickness of 10-400 microns, preferably 40-200 microns.

In another embodiment, the bonding layer is a double-layer laminate, wherein one layer is a polymer sheet formed from polymer materials selected from ethylene-$C_{1-4}$ alkyl methacrylate copolymers, ethylene-$C_{1-4}$ alkyl acrylate copolymers, ethylene-methacrylic acid copolymers, ethylene-acrylic acid copolymers, ethylene-maleic anhydride copolymers, copolymers formed from ethylene with at least two monomers selected from $C_{1-4}$ alkyl methacrylate, ethylene-$C_{1-4}$ alkyl acrylate, methacrylic acid, acrylic acid, and maleic anhydride; and glycidyl methacrylate-containing copolymers formed from ethylene and glycidyl methacrylate and at least one co-monomer selected from $C_{1-4}$ alkyl methacrylate, $C_{1-4}$ alkyl acrylate, methacrylic acid, acrylic acid, and maleic anhydride, and blends of two or more polymers described above. Another layer is a polymer sheet formed from polymer materials selected from polyethylene, polypropylene, ethylene-propylene copolymers, ethylene-$C_{1-4}$ alkyl methacrylate copolymers, ethylene-$C_{1-4}$ alkyl acrylate copolymers, ethylene-methacrylic acid copolymers, ethylene-acrylic acid copolymers, ethylene-maleic anhydride copolymers, copolymers formed from ethylene and at least two monomers selected from $C_{1-4}$ alkyl methacrylate, $C_{1-4}$ alkyl acrylate, methacrylic acid, acrylic acid, and maleic anhydride, and glycidyl methacrylate-containing copolymers formed from ethylene and glycidyl methacrylate with at least one co-monomer selected from $C_{1-4}$ alkyl methacrylate, $C_{1-4}$ alkyl acrylate, methacrylic acid, acrylic acid, and maleic anhydride, and blends of two or more polymers described above.

In another embodiment, the bonding layer is a tri-layer laminate, wherein one layer is a polymer sheet formed from polymer materials selected from ethylene-$C_{1-4}$ alkyl methacrylate copolymers, ethylene-$C_{1-4}$ alkyl acrylate copolymers, ethylene-methacrylic acid copolymers, ethylene-acrylic acid copolymers, ethylene-maleic anhydride copolymers, copolymers formed from ethylene and at least two monomers selected from $C_{1-4}$ alkyl methacrylate, $C_{1-4}$ alkyl acrylate, methacrylic acid, acrylic acid, and maleic anhydride; and glycidyl methacrylate-containing copolymers formed from ethylene and glycidyl methacrylate with at least one co-monomer selected from $C_{1-4}$ alkyl methacrylate, $C_{1-4}$ alkyl acrylate, methacrylic acid, acrylic acid, and maleic anhydride, and blends of two or more polymers described above. Another layer is a polymer sheet formed by polymer materials selected from polyethylene, polypropylene, ethylene-propylene copolymers, ethylene-$C_{1-4}$ alkyl methacrylate copolymers, ethylene-$C_{1-4}$ alkyl acrylate copolymers, ethylene-methacrylic acid copolymers, ethylene-acrylic acid copolymers, ethylene-maleic anhydride copolymers, copolymers formed from ethylene and at least two monomers selected from $C_{1-4}$ alkyl methacrylate, $C_{1-4}$ alkyl acrylate, methacrylic acid, acrylic acid, and maleic anhydride, and glycidyl methacrylate-containing copolymers formed from ethylene and glycidyl methacrylate with at least one co-monomer selected from $C_{1-4}$ alkyl methacrylate, $C_{1-4}$ alkyl acrylate, methacrylic acid, acrylic acid, and maleic anhydride, or blends of two or more polymers described above. Yet another layer is a polymer sheet formed from polymer materials selected from polyethylene, polypropylene, ethylene-propylene copolymers, ethylene-$C_{1-4}$ alkyl methacrylate copolymers, ethylene-$C_{1-4}$ alkyl acrylate copolymers, ethylene-methacrylic acid copolymers, ethylene-acrylic acid copolymers, ethylene-maleic anhydride copolymers, copolymers formed from ethylene and at least two monomers selected from $C_{1-4}$ alkyl methacrylate, $C_{1-4}$ alkyl acrylate, methacrylic acid, acrylic acid, and maleic anhydride, and glycidyl methacrylate-containing copolymers formed from ethylene and glycidyl methacrylate with at least one co-monomer selected from $C_{1-4}$ alkyl methacrylate, $C_{1-4}$ alkyl acrylate, methacrylic acid, acrylic acid, and maleic anhydride, or blends of two or more polymers described above.

The polyethylene and polypropylene suitable for the bonding layer include high density polyethylene, medium density polyethylene, low density polyethylene, linear low density polyethylene, metallocene-derived low density polyethylene, and homopolypropylene.

Two or more extruders may be used for bonding the multilayer laminated film of the bonding layer to the substrate of the present invention by extrusion-coating.

In order to increase the bonding strength between the substrate and the bonding layer, the substrate surface may be surface-treated. There are no restrictions to suitable surface treatment methods, which may be any conventional methods known in the art. For example, it may be a corona treatment, flame treatment, or primer treatment. Non-restrictive examples of suitable primers include, for example, imine primers and amine primers.

When primer treatment is used for surface treatment of the substrate surface, there are no specific restrictions to the final thickness of the formed primer, which may be any thickness commonly used in the art, as long as the primer does not adversely affect the bonding strength between the polyester substrate and the bonding layer. The primer thickness is usually less than 1.5 microns, suitably less than 1.2 microns, preferably less than 1 micron, more preferably less than 0.99 microns, most preferably less than 0.8 microns, and optimally less than 0.5 microns. For example, the primer thickness can be less than 0.45 microns, less than 0.4 microns, less than 0.3 microns or less than 0.25 microns.

In one embodiment, the primer thickness is 0.01-0.99 microns, suitably 0.01-0.8 microns, preferably 0.01-0.5 microns.

When surface treatment methods such as corona treatment or flame treatment are used, the bonding layer is directly placed on the substrate.

In the present invention, the phrase "bonding layer is directly placed on the substrate" refers to a situation where there is no coat or layer applied between the bonding layer and the substrate for improving the bonding strength between the two.

The laminated film has high bonding or peeling strength between the substrate and the bonding layer. Compared with the bonding strength between the substrate and bonding layer found in the art, the bonding strength between the two layers of the laminated film is higher, and the bonding strength may be as high as about 10N/cm according to a T-type peeling test.

The laminated film is particularly suitable for making a back sheet of a crystalline silicon solar module or for making a front sheet or a back sheet of a thin film solar module. This type of back sheet or front sheet not only has good peeling strength, but also avoids delamination between the bonding layer and the encapsulation layer of ethylene-vinyl acetate copolymer due to a very high bonding strength between the bonding layer and the encapsulation layer of ethylene-vinyl acetate copolymer, and can effectively extend the service life of solar modules.

The present invention is further exemplified by the following illustrative examples.

EXAMPLES

Test Methods
1. Test for Peeling Strength Between the Substrate and the Bonding Layer of the Laminated Film.

A laminated film was cut into sample strips of 2.54 cm in width and 10 cm in length, and the bonding layer and the substrate were fixed respectively in the upper and lower grips of an extension meter to carry out a peeling test at a speed of 5 in/min.

2. Test of Peeling Strength Between the Bonding Layer and the Encapsulant of Ethylene-Vinyl Acetate Copolymer A laminated film (with the bonding layer adjacent to the encapsulation film), an encapsulation film of ethylene-vinyl acetate copolymer and a piece of glass were stacked in a proper order and placed in a laminating press for cross-linking for 15 min under an operation temperature of 140° C. Then, the sample was cut into strips of 2.54 cm in width and 10 cm in length. The laminated film of the back sheet and the encapsulant/glass layer were fixed respectively in the upper and lower grips of an extension meter to carry out a peeling test at a speed of 5 in/min.

3. Hydrothermal Aging Test for Solar Cell Components

The process for encapsulating solar cell components includes sorting the solar cells, single welding, serial welding, stacking, laminating, component testing, framing and cleaning. The hydrothermal aging test of laminated solar cell components was carried out in a climatic chamber VC4018 (purchased from Vötsch Industrietechnik GmbH, Germany) according to Clause 10.13 of IEC 61215 Standard. Solar cell components for testing were maintained for 1,000 hrs under the hydrothermal conditions (85° C. and 85% relative humidity). Then, the components were taken out, and the encapsulation layer of ethylene-vinyl acetate copolymer was peeled off. The peeled encapsulation layer of ethylene-vinyl acetate copolymer was tested for its yellowing index, $\Delta YI$, on a Lambda 950 UV/visible/Near-IR spectrophotometer (including a 150 mm integrating sphere) from Perkin Elmer, U.S.A.:

$$\Delta YI = Y_1 - Y_0$$

where $Y_0$ is the value of extinction of the encapsulation layer of ethylene-vinyl acetate copolymer peeled without being treated under the hydrothermal conditions, measured with a Lambda 950 UV/visible/Near-IR spectrophotometer. $Y_1$ is the value of extinction of the encapsulation layer of ethylene-vinyl acetate copolymer peeled after being treated under the hydrothermal conditions, which was also measured with a Lambda 950 UV/visible/Near-IR spectrophotometer. If the index equals zero, it means that the encapsulant was not influenced by outside oxygen and moisture when placed under the hydrothermal conditions. In other words, the solar cell has excellent air tightness. Therefore, the smaller the index, the better.

4. Testing Method for Solar Cell Output Power

Solar cell output power was determined by using a 3500 SLP component testing system (purchased from Spire Corporation, U.S.A.). It was compared with polycrystalline silicon solar cells assembled from ordinary front and back sheet materials.

5. Testing Method of Bonding Strength of a Bonding Layer Between Layers of a Laminated Film A laminated film was cut into sample strips of 2.54 cm in width and 10 cm in length, and the top layer and the bottom layer were fixed respectively in the upper and lower grips of an extension meter to carry out a peeling test at a speed of 5 in/min.

Comparative Example 1

In this example, a back sheet made of a laminate film with a structure of PVF/PET/PVF purchased from Isovolta Group was used. PVF is an abbreviation for 'polyvinylidene fluoride.'

By using the above-described method, the peeling strength between PVF and PET was determined to be 4 N/cm.

By using the above-described method, the peeling strength between the back sheet and the EVA encapsulation layer after lamination was determined to be 4.5 N/cm.

Preparing a Solar Module

The following components were stacked in the following order and then laminated by thermocompression under vacuum to form a solar module:

A 3.2 mm-thick tempered glass purchased from Dongguan CSG Solar Glass Co., Ltd.;

EVA encapsulation film (500 micron, Ruifu brand EVA film for making photovoltaic cells, R767, purchased from Ruiyang Photovoltaic Material Co., Ltd.);

Polycrystalline silicon photovoltaic circuits (125×125×0.3 mm, 72 circuits in series);

EVA encapsulation film (500 micron, Ruifu brand EVA film for making photovoltaic cells, R767, purchased from Ruiyang Photovoltaic Material Co., Ltd.); and A back sheet made of the above-described laminated film from Comparative Example 1.

By using the above-described method, the output power of the assembled solar cells was determined to be 175 watts.

By using the above-described method to carry out a hydrothermal aging test of the solar cell components, the yellowing index ΔYI was determined to be 0.6.

Example 1

Preparing a Laminated Film and Testing Properties Thereof

A layer of a 25 micron-thick Tedlar™ polyfluoroethylene film purchased from E. I. du Pont de Nemours and Company, Wilmington, Del., USA ("DuPont"), was bonded on a major surface of a 200 micron-thick polyethylene terephthalate sheet that is also purchased from DuPont. The adhesive used was a 9:1 (w/w) mixture of PP5250/I5200 polyurethane adhesive purchased from Mitsubishi, Japan. The adhesive layer was 12 microns thick.

On an extrusion-coating machine manufactured by Davis Standard, Epomin P-1050 (made by Nippon Shokubai Co., Ltd.) was coated as a 0.90 micron-thick primer on another major surface of the polyethylene terephthalate sheet. Then, a layer of ethylene-methacrylate copolymer (with 80% being from ethylene monomer) was extrusion-coated at 290° C. on the primed surface with a thickness of 75 microns to form a laminated film.

By using the above-described method, the peeling strength between the polyethylene terephthalate sheet and the ethylene-methacrylate copolymer layer was determined to be 21 N/cm. Compared with the peeling strength of the conventional laminated film described in Comparative Example 1, the laminated film of the present invention is increased 4 fold.

After accelerated hydrothermal aging under conditions of 85° C. and 85% RH (relative humidity) for 1,000 hrs, the peeling strength was determined to be 12 N/cm.

By using the above-described method, the peeling strength between the ethylene-methacrylate copolymer layer and the ethylene-vinyl acetate copolymer encapsulant was determined to be 81 N/cm. Compared with the peeling strength between the conventional laminated film (Comparative Example 1) and the ethylene-vinyl acetate copolymer encapsulant, the peeling strength between the laminated film of this example and the ethylene-vinyl acetate copolymer encapsulant is increased by about 16 fold.

Preparing a Solar Module

The following components were stacked in the following order and then laminated by thermocompression under vacuum to form a solar module:

A 3.2 mm-thick tempered glass purchased from Dongguan CSG Solar Glass Co., Ltd.;

EVA encapsulation film (500 micron, Ruifu brand EVA film for making photovoltaic cells, R767, purchased from Ruiyang Photovoltaic Material Co., Ltd.);

Polycrystalline silicon photovoltaic circuits (125×125×0.3 mm, 72 circuits in series);

EVA encapsulation film (500 micron, Ruifu brand EVA film for making photovoltaic cells, R767, purchased from Ruiyang Photovoltaic Material Co., Ltd.); and The above-described laminated film from Example 1 has the above-described ethylene-methacrylate copolymer facing the above-described EVA film.

By using the above-described method, the output power of the assembled solar cells was determined to be 177 watts.

Hydrothermal Aging Test on Solar Cell Components

By using the above-described method to carry out a hydrothermal aging test of the solar cell components, the calculated result of the yellowing index ΔYI was 0.1.

Comparative Example 2

PET, as described in Example 1 of JP2008-108947, and an ethylene-methacrylate copolymer, as described in Example 1 of JP2008-108947, were laminated by thermocompression, and then the peeling strength between them was tested. The initial peeling strength was 1.5 N/cm. After accelerated hydrothermal aging for 1,000 hrs, the peeling strength was less than 0.7 N/cm.

Comparative Example 3

PET, as described in Example 1 of JP2008-108947, and an ethylene-methacrylate copolymer, as described in Example 1 of JP2008-108947, were bonded with a polyurethane adhesive (polyester-based polyurethane matrix and a mixed curing agent of isophorone diisocyanate (IPDI) and xylylene diisocyanate (XDI). The initial peeling strength between them was 7.5 N/cm. After accelerated hydrothermal aging, the peeling strength was less than 0.8 N/cm.

Example 2

Preparing a Laminated Film AND Testing Properties Thereof

A layer of a 25 micron-thick Tedlar™ polyfluoroethylene film purchased from DuPont was bonded on a major surface of a 200 micron-thick polyethylene terephthalate sheet that was also purchased from DuPont. The adhesive used was a 9:1 (w/w) mixture of PP5250/I5200 polyurethane adhesive purchased from Mitsubishi, Japan. The adhesive layer was 12 microns thick.

On an extrusion-coating machine manufactured by Davis Standard, Epomin P-1050 (made by Nippon Shokubai Co., Ltd.) was coated as a 0.50 micron-thick primer on another major surface of the polyethylene terephthalate sheet. Then, a layer of ethylene-methacrylate copolymer (with 80% w/w being from ethylene monomer) containing 5% (w/w) of titanium dioxide additive by total weight of the copolymer was extrusion-coated at 290° C. on the primed surface to form a laminated film with a thickness of 75 microns.

By using the above-described method, the peeling strength between the polyethylene terephthalate sheet and the ethylene-methacrylate copolymer layer was determined to be 20

N/cm. After accelerated hydrothermal aging under conditions of 85° C. and 85% RH for 1,000 hrs, the peeling strength was determined to be 12 N/cm.

By using the above-described method, the peeling strength between the ethylene-methacrylate copolymer layer and the ethylene-vinyl acetate copolymer encapsulant was determined to be 80 N/cm.

Preparing a Solar Module

The following components were stacked in the following order and then laminated by thermocompression under vacuum to form a solar module:

A 3.2 mm-thick tempered glass purchased from Dongguan CSG Solar Glass Co., Ltd.;

EVA encapsulation film (500 micron, Ruifu brand EVA film for making photovoltaic cells, R767, purchased from Ruiyang Photovoltaic Material Co., Ltd.);

Polycrystalline silicon photovoltaic circuits (125×125×0.3 mm, 72 circuits in series);

EVA encapsulation film (500 micron, Ruifu brand EVA film for making photovoltaic cells, R767, purchased from Ruiyang Photovoltaic Material Co., Ltd.); and The above-described laminated film from Example 2 (with the above-described ethylene-methacrylate copolymer facing the above-described EVA film).

By using the above-described method, the output power of the assembled solar cells was determined to be 177 watts.

Hydrothermal Aging Test on Solar Cell Components

By using the above-described method to carry out a hydrothermal aging test of the solar cell components, the calculated result for the yellowing index ΔYI was 0.1.

Example 3

Preparing a Laminated Film and Testing Properties Thereof

A layer of a 25 micron-thick Tedlar™ polyfluoroethylene film purchased from DuPont was bonded on a major surface of a 200 micron-thick polyethylene terephthalate sheet that was also purchased from DuPont. The adhesive used was a 9:1 (w/w) mixture of PP5250/I5200 polyurethane adhesive purchased from Mitsubishi, Japan. The adhesive layer is 12 microns thick.

On an extrusion-coating machine manufactured by Davis Standard, Epomin P-1050 (made by Nippon Shokubai Co., Ltd.) was coated as a 0.45 micron-thick primer on another major surface of the polyethylene terephthalate sheet. Then, a 1:9 (w/w) mixture of ethylene-maleic anhydride copolymer (with 80% w/w being from ethylene monomer) and ethylene-methacrylate copolymer (with 80% w/w being from ethylene monomer) containing 5% (w/w) of titanium dioxide additive by total weight of the copolymer mixture was extrusion-coated on the primed surface to form a laminated film with a thickness of 75 microns.

By using the above-described method, the peeling strength between the polyethylene terephthalate sheet and the bonding layer was determined to be 23 N/cm. After accelerated hydrothermal aging under conditions of 85° C. and 85% RH for 1,000 hrs, the peeling strength was determined to be 12 N/cm.

By using the above-described method, the peeling strength between the bonding layer and the encapsulation layer of ethylene-vinyl acetate copolymer was determined to be 80 N/cm.

Preparing a Solar Module

The following components were stacked in the following order and then laminated by thermocompression under vacuum to form a solar module:

A 3.2 mm-thick tempered glass purchased from Dongguan CSG Solar Glass Co., Ltd.;

EVA encapsulation film (500 micron, Ruifu brand EVA film for making photovoltaic cells, R767, purchased from Ruiyang Photovoltaic Material Co., Ltd.);

Polycrystalline silicon photovoltaic circuits (125×125×0.3 mm, 72 circuits in series);

EVA encapsulation film (500 micron, Ruifu brand EVA film for making photovoltaic cells, R767, purchased from Ruiyang Photovoltaic Material Co., Ltd.); and The above-described laminated film from Example 3 has the above-described copolymer mixture facing the above-described EVA film.

By using the above-described method, the output power of the assembled solar cells was determined to be 178 watts.

Hydrothermal Aging Test on Solar Cell Components

By using the above-described method to carry out a hydrothermal aging test of the solar cell components, the calculated result of the yellowing index ΔYI was 0.1.

Example 4

A layer of a 25 micron-thick Tedlar™ polyfluoroethylene film purchased from DuPont was bonded on a major surface of a 200 micron-thick polyethylene terephthalate sheet that was also purchased from DuPont. The adhesive used was a 9:1 (w/w) mixture of PP5250/I5200 polyurethane adhesive purchased from Mitsubishi, Japan. The adhesive layer was 12 microns thick.

On an extrusion-coating machine manufactured by Davis Standard, Epomin P-1050 (made by Nippon Shokubai Co., Ltd.) was coated as a 0.48 micron-thick primer on another major surface of the polyethylene terephthalate sheet. Then, a layer of ethylene-butyl acrylate-methacrylic acid terpolymer (the ratio of the three monomer units is 88.5:7.5:4 by weight) was extrusion-coated on the primed surface to form a laminated film with a thickness of 75 microns.

By using the above-described method, the peeling strength between the polyethylene terephthalate sheet and the bonding layer was determined to be 25 N/cm. After accelerated hydrothermal aging under conditions of 85° C. and 85% RH for 1,000 hrs, the peeling strength was determined to be 12 N/cm.

By using the above-described method, the peeling strength between the bonding layer and the encapsulation layer of ethylene-vinyl acetate copolymer was determined to be 82 N/cm.

Preparing a Solar Module

The following components were stacked in the following order and then laminated by thermocompression under vacuum to form a solar module:

A 3.2 mm-thick tempered glass purchased from Dongguan CSG Solar Glass Co., Ltd.;

EVA encapsulation film (500 micron, Ruifu brand EVA film for making photovoltaic cells, R767, purchased from Ruiyang Photovoltaic Material Co., Ltd.);

Polycrystalline silicon photovoltaic circuits (125×125×0.3 mm, 72 circuits in series);

EVA encapsulation film (500 micron, Ruifu brand EVA film for making photovoltaic cells, R767, purchased from Ruiyang Photovoltaic Material Co., Ltd.); and The above-described laminated film from Example 4 has the above-described terpolymer facing the above-described EVA film.

By using the above-described method, the output power of the assembled solar cells was determined to be 175 watts.

Hydrothermal Aging Test on Solar Cell Components

By using the above-described method to carry out a hydrothermal aging test of the solar cell components, the calculated result for the yellowing index ΔYI was 0.1.

Example 5

A layer of a 25 micron-thick Tedlar™ polyfluoroethylene film purchased from DuPont was bonded on a major surface of a 200 micron-thick polyethylene terephthalate sheet that was also purchased from DuPont. The adhesive used was a 9:1 (w/w) mixture of PP5250/I5200 polyurethane adhesive purchased from Mitsubishi, Japan. The adhesive layer was 12 microns thick.

On an extrusion-coating machine manufactured by Davis Standard, Epomin P-1050 (made by Nippon Shokubai Co., Ltd.) was coated as a 0.48 micron-thick primer on another major surface of the polyethylene terephthalate sheet. Then, a layer of ethylene-butyl acrylate-glycidyl methacrylate terpolymer (with 25% w/w being from butyl acrylate monomer and 12% w/w being from glycidyl methacrylate monomer) was extrusion-coated on the primed surface to form a laminated film.

By using the above-described method, the peeling strength between the polyethylene terephthalate sheet and the bonding layer was determined to be 26 N/cm. After accelerated hydrothermal aging under conditions of 85° C. and 85% RH for 1,000 hrs, the peeling strength was determined to be 11 N/cm.

By using the above-described method, the peeling strength between the bonding layer and the ethylene-vinyl acetate copolymer encapsulant was determined to be 80 N/cm.

Preparing a Solar Module

The following components were stacked in the following order and then laminated by thermocompression under vacuum to form a solar module:

A 3.2 mm-thick tempered glass purchased from Dongguan CSG Solar Glass Co., Ltd.;
EVA encapsulation film (500 micron, Ruifu brand EVA film for making photovoltaic cells, R767, purchased from Ruiyang Photovoltaic Material Co., Ltd.);
Polycrystalline silicon photovoltaic circuits (125×125×0.3 mm, 72 circuits in series);
EVA encapsulation film (500 micron, Ruifu brand EVA film for making photovoltaic cells, R767, purchased from Ruiyang Photovoltaic Material Co., Ltd.); and
The above-described laminated film from Example 5 has the above-described terpolymer facing the above-described EVA film.

By using the above-described method, the output power of the assembled solar cells was determined to be 178 watts.

Hydrothermal Aging Test on Solar Cell Components

By using the above-described method to carry out a hydrothermal aging test of the solar cell components, the calculated result for the yellowing index ΔYI was 0.1.

Example 6

A layer of a 25 micron-thick Tedlar™ polyfluoroethylene film purchased from DuPont, was bonded on a major surface of a 200 micron-thick polyethylene terephthalate sheet that was also purchased from DuPont. The adhesive used was a 9:1 (w/w) mixture of PP5250/I5200 polyurethane adhesive purchased from Mitsubishi, Japan. The adhesive layer was 12 microns thick.

On an extrusion-coating machine manufactured by Davis Standard, Epomin P-1050 (made by Nippon Shokubai Co., Ltd.) was coated as a 0.5 micron-thick primer on another major surface of the polyethylene terephthalate sheet. Then, a layer of ethylene-methyl acrylate-maleic anhydride terpolymer (with 20% w/w being from methyl acrylate monomer and 0.3% w/w being from maleic anhydride monomer) was extrusion-coated on the primed surface to form a laminated film.

By using the above-described method, the peeling strength between the polyethylene terephthalate sheet and the bonding layer was determined to be 26 N/cm. After accelerated hydrothermal aging under conditions of 85° C. and 85% RH for 1,000 hrs, the peeling strength was determined to be 11 N/cm.

By using the above-described method, the peeling strength between the bonding layer and the ethylene-vinyl acetate copolymer encapsulant was determined to be 80 N/cm.

Preparing a Solar Module

The following components were stacked in the following order and then laminated by thermocompression under vacuum to form a solar module:

A 3.2 mm-thick tempered glass purchased from Dongguan CSG Solar Glass Co., Ltd.;
EVA encapsulation film (500 micron, Ruifu brand EVA film for making photovoltaic cells, R767, purchased from Ruiyang Photovoltaic Material Co., Ltd.);
Polycrystalline silicon photovoltaic circuits (125×125×0.3 mm, 72 circuits in series);
EVA encapsulation film (500 micron, Ruifu brand EVA film for making photovoltaic cells, R767, purchased from Ruiyang Photovoltaic Material Co., Ltd.); and
The above-described laminated film from Example 6 has the above-described terpolymer facing the above-described EVA film.

By using the above-described method, the output power of the assembled solar cells was determined to be 178 watts.

Hydrothermal Aging Test on Solar Cell Components

By using the above-described method to carry out a hydrothermal aging test of the solar cell components, the calculated result for the yellowing index ΔYI was 0.1.

Example 7

A major surface of a 200 micron-thick polyethylene terephthalate sheet purchased from DuPont was corona-treated.

On an extrusion-coating machine manufactured by Davis Standard, a layer of ethylene-methyl acrylate-maleic anhydride terpolymer (with 20% w/w being from methyl acrylate monomer and 0.3% w/w being from maleic anhydride monomer) was extrusion-coated on the corona-treated surface of the polyethylene terephthalate sheet to form a laminated film.

By using the above-described method, the peeling strength between the polyethylene terephthalate sheet and the bonding layer was determined to be 12 N/cm. After accelerated hydrothermal aging under conditions of 85° C. and 85% RH for 1,000 hrs, the peeling strength was determined to be 6 N/cm.

By using the above-described method, the peeling strength between the bonding layer and the ethylene-vinyl acetate copolymer encapsulant was determined to be 80 N/cm.

Preparing a Solar Module

The following components were stacked in the following order and then laminated by thermocompression under vacuum to form a solar module:

A 3.2 mm-thick tempered glass purchased from Dongguan CSG Solar Glass Co., Ltd.;
EVA encapsulation film (500 micron, Ruifu brand EVA film for making photovoltaic cells, R767, purchased from Ruiyang Photovoltaic Material Co., Ltd.);
Polycrystalline silicon photovoltaic circuits (125×125×0.3 mm, 72 circuits in series);

EVA encapsulation film (500 micron, Ruifu brand EVA film for making photovoltaic cells, R767, purchased from Ruiyang Photovoltaic Material Co., Ltd.); and The above-described laminated film from Example 7 has the above-described terpolymer facing the above-described EVA film.

By using the above-described method, the output power of the assembled solar cells was determined to be 175 watts.

Hydrothermal Aging Test on Solar Cell Components

By using the above-described method to carry out a hydrothermal aging test of the solar cell components, the calculated result for the yellowing index ΔYI was 0.1.

Example 8

A layer of a 25 micron-thick Tedlar™ polyfluoroethylene film purchased from DuPont was bonded on a major surface of a 200 micron-thick polyethylene terephthalate sheet that was also purchased from DuPont. The adhesive used was a 9:1 (w/w) mixture of PP5250/I5200 polyurethane adhesive purchased from Mitsubishi, Japan. The adhesive layer was 12 microns thick.

On an extrusion-coating machine manufactured by Davis Standard, Epomin P-1050 (made by Nippon Shokubai Co., Ltd.) was coated as a 0.50 micron-thick primer on another major surface of the polyethylene terephthalate sheet. Then, two layers of ethylene copolymer were extrusion-coated on the primed surface to form a laminated film: one layer is an ethylene-methyl acrylate copolymer (with 20% w/w being from methyl acrylate monomer), and another layer is an ethylene-methyl acrylate copolymer (with 6% w/w being from methyl acrylate monomer) containing 5% titanium dioxide and 1% silicon dioxide.

By using the above-described method, the peeling strength between the polyethylene terephthalate sheet and the bonding layer was determined to be 22 N/cm. After accelerated hydrothermal aging under conditions of 85° C. and 85% RH for 1,000 hrs, the peeling strength was determined to be 18 N/cm.

By using the above-described method, the peeling strength between the bonding layer and the ethylene-vinyl acetate copolymer encapsulant was determined to be 48 N/cm.

Preparing a Solar Module

The following components were stacked in the following order and then laminated by thermocompression under vacuum to form a solar module:

A 3.2 mm-thick tempered glass purchased from Dongguan CSG Solar Glass Co., Ltd.;

EVA encapsulation film (500 micron, Ruifu brand EVA film for making photovoltaic cells, R767, purchased from Ruiyang Photovoltaic Material Co., Ltd.);

Polycrystalline silicon photovoltaic circuits (125×125×0.3 mm, 72 circuits in series);

EVA encapsulation film (500 micron, Ruifu brand EVA film for making photovoltaic cells, R767, purchased from Ruiyang Photovoltaic Material Co., Ltd.); and The above-described laminated film from Example 8 has the above-described copolymer facing the above-described EVA film.

By using the above-described method, the output power of the assembled solar cells was determined to be 178 watts.

Hydrothermal Aging Test on Solar Cell Components

By using the above-described method to carry out a hydrothermal aging test of the solar cell components, the calculated result for the yellowing index ΔYI was 0.1.

It can be seen from the above-described test results that the laminated film of the present invention has improved bonding strength between its film layers, and, therefore, can resist delamination. When the laminated film of the present invention is used for making the back sheet of a solar module, the back sheet will have improved bonding strength with the encapsulation layer. As a result, solar modules that use the laminated film of the present invention as the back sheet not only have extended service life, but also have improved barrier properties to prevent oxygen and moisture from penetrating into the entire solar module, thus yielding very good results.

What is claimed is:

1. A process for manufacturing a solar module, comprising:

providing a polyester substrate comprising polymers selected from the group consisting of polyC$_{2-6}$ alkylene phthalates, polyC$_{2-6}$ alkylene naphthalates, and mixtures or blends thereof, said polyester substrate having first and second opposite surfaces;

providing a protective layer comprising a fluoropolymer with a tensile modulus of greater than 150 Kpsi;

adhering the protective layer to the first surface of the polyester substrate with an adhesive;

applying a primer layer on the second surface of the polyester substrate, wherein the primer layer is less than 0.99 micron thick;

extruding a bonding layer over the primer layer on the second surface of the polyester substrate, said bonding layer comprising a copolymer of ethylene and one or more monomers selected from the group consisting of C$_{1-4}$ alkyl acrylates, C$_{1-4}$ alkyl methacrylates, methacrylic acid, acrylic acid, glycidyl methacrylate, and maleic anhydride, said bonding layer having a thickness of 10 to 400 microns;

providing one or more solar cells that are encapsulated with a polymeric encapsulant material; and positioning the bonding layer against the polymeric encapsulant material and applying heat and pressure to the bonding layer and the polymeric encapsulant material so as to bond the polyester substrate to the polymeric encapsulant material, wherein the peeling strength between said polyester substrate and said bonding layer is at least 10 N/cm and wherein the peeling strength between the bonding layer and the encapsulant material is at least 48 N/cm.

2. The process of claim 1 wherein the polymeric encapsulant comprises ethylene vinyl acetate copolymer.

3. The process of claim 1 further comprising the step of applying corona treatment or flame treatment to the second surface of the polyester substrate before the bonding layer is extruded over the second surface of the polyester substrate.

4. The process of claim 1, wherein the polyester substrate further comprises a coat of metal, metal oxide, or non-metal oxide.

5. The process of claim 1, wherein the polyC$_{2-6}$alkylene phthalate is selected from the group consisting of polyethylene terephthalate, polytrimethylene terephthalate, polybutylene terephthalate, polyhexylene terephthalate, polyethylene o-phthalate, polytrimethylene o-phthalate, polybutylene o-phthalate and polyhexylene o-phthalate, and the polyC$_{2-6}$alkylene naphthalate is selected from the group consisting of polyethylene naphthalate, polytrimethylene naphthalate and polybutylene naphthalate.

6. The process of claim 1, wherein the fluoropolymer is selected from the group consisting of polymers of fluoroethylene; copolymers of fluoroethylene with other non-fluorinated, partially-fluorinated or perfluorinated monomers; polymers of vinylidene fluoride; copolymers of vinylidene fluoride with other non-fluorinated, partially-fluorinated or perfluorinated monomers; polymers of chlorotrifluoroethylene; copolymers of chlorotrifluoroethylene with other non-fluorinated, partially-fluorinated or perfluorinated monomers; polymers of tetrafluoroethylene; and copolymers of tetrafluoroethylene with other non-fluorinated, partially-fluorinated or perfluorinated monomers.

7. The process of claim 6, wherein the other non-fluorinated, partially-fluorinated or perfluorinated monomers are selected from the group consisting of ethylene, propylene, fluoroethylene, ethylene difluoride, vinylidene fluoride, chlorotrifluoroethylene, hexafluoropropylene, tetrafluoroethylene, perfluoroalkoxyvinyl ether and perfluoropropylene.

8. The process of claim 1, wherein the polyester substrate comprises:
(a) a layer comprising copolymers selected from the group consisting of poly$C_{2-6}$ alkylene phthalates, poly$C_{2-6}$ alkylene naphthalates, and mixtures or blends thereof; and
(b) a layer comprising polyfluoroethylene or polyvinylidene fluoride.

9. The process of claim 1, wherein the bonding layer comprises a copolymer of ethylene and one or more monomers selected from the group consisting of methyl methacrylate, methyl acrylate, ethyl methacrylate, ethyl acrylate, propyl methacrylate, propyl acrylate, butyl methacrylate, butyl acrylate, glycidyl methacrylate and maleic anhydride.

10. The process of claim 9, wherein the ethylene is 50-99% by weight based on the total weight of the copolymer.

11. The process of claim 1, wherein the copolymer of the bonding layer is selected from ethylene-methyl acrylate-methacrylic acid terpolymers, ethylene-butyl acrylate-methacrylic acid terpolymers, ethylene-propyl methacrylate-acrylic acid terpolymers, ethylene-butyl acrylate-glycidyl methacrylate terpolymers, and ethylene-methyl acrylate-maleic anhydride terpolymers.

12. The process of claim 11, wherein the copolymer is an ethylene-butyl acrylate-glycidyl methacrylate terpolymer and butyl acrylate is 2-30% by weight, and glycidyl methacrylate accounts for 1-15% by weight based on the weight of the terpolymer.

13. The process of claim 1, wherein the bonding layer is a single layer of a copolymer of ethylene and one or more monomers selected from the group consisting of $C_{1-4}$ alkyl acrylates, $C_{1-4}$ alkyl methacrylates, methacrylic acid, glycidyl methacrylate, and maleic anhydride.

14. The process of claim 1, wherein the bonding layer is a 2-8 layer laminate, wherein each layer of the laminate is a copolymer of ethylene and one or more monomers selected from the group consisting of $C_{1-4}$ alkyl acrylates, $C_{1-4}$ alkyl methacrylates, methacrylic acid, glycidyl methacrylate, and maleic anhydride.

15. The process of claim 1, wherein the bonding layer further comprises one or more polymer layers formed by polymer materials selected from polyethylene; polypropylene; ethylene-propylene copolymers; ethylene-$C_{1-4}$ alkyl methacrylate copolymers; ethylene-methacrylic acid copolymers; ethylene-maleic anhydride copolymers; copolymers derived from ethylene and at least two monomers selected from $C_{1-4}$ alkyl methacrylate, methacrylic acid and maleic anhydride; glycidyl methacrylate-containing copolymers formed from ethylene and glycidyl methacrylate with at least one co-monomer selected from $C_{1-4}$ alkyl methacrylate, methacrylic acid and maleic anhydride; and blends thereof,
wherein the polyethylene is selected from high density polyethylene, medium density polyethylene, low density polyethylene, linear low density polyethylene, metallocene-derived low density polyethylene, and the polypropylene is homopolypropylene.

16. The process of claim 1, wherein the primer layer comprises an imine or amine-containing primer.

17. The process of claim 1, wherein the adhesive layer comprises polyurethane.

18. The process of claim 1, wherein the solar cell(s) are selected from monocrystalline silicon solar cells, polycrystalline silicon solar cells and nano-silicon solar cells.

19. The process of claim 1, wherein the solar cells are selected from non-crystalline thin-film silicon solar cells, cadmium telluride thin-film solar cells, and copper indium gallium selenide thin-film solar cells.

* * * * *